United States Patent
Yoon et al.

(10) Patent No.: US 8,067,768 B2
(45) Date of Patent: Nov. 29, 2011

(54) THIN-FILM TRANSISTOR DISPLAY PANEL INCLUDING AN OXIDE ACTIVE LAYER AND A NITROGEN OXIDE PASSIVATION LAYER, AND METHOD OF FABRICATING THE SAME

(75) Inventors: Kap-Soo Yoon, Seoul (KR); Do-Hyun Kim, Seongnam-si (KR); Sung-Hoon Yang, Seoul (KR); Ki-Hun Jeong, Cheonan-si (KR); Jae-Ho Choi, Seoul (KR); Seung-Mi Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/780,246

(22) Filed: May 14, 2010

(65) Prior Publication Data

US 2011/0001137 A1    Jan. 6, 2011

(30) Foreign Application Priority Data

Jul. 6, 2009    (KR) ........................ 10-2009-0061249

(51) Int. Cl.
    *H01L 29/786*      (2006.01)

(52) U.S. Cl. .................. 257/43; 257/E29.068
(58) Field of Classification Search .............. 257/59, 257/72, 43, E29.068; 438/151
See application file for complete search history.

(56) References Cited

U.S. PATENT DOCUMENTS

| | | | |
|---|---|---|---|
| 7,144,819 B2 * | 12/2006 | Sato et al. | 438/700 |
| 7,492,090 B2 * | 2/2009 | Yamazaki et al. | 313/503 |
| 7,586,131 B2 * | 9/2009 | Nishiki et al. | 257/202 |
| 7,786,494 B2 * | 8/2010 | Lee et al. | 257/88 |
| 2005/0112883 A1 * | 5/2005 | Savas et al. | 438/689 |
| 2007/0152219 A1 * | 7/2007 | Lim | 257/59 |
| 2007/0187689 A1 * | 8/2007 | Oh et al. | 257/72 |
| 2007/0262315 A1 * | 11/2007 | Lee et al. | 257/72 |
| 2008/0108226 A1 * | 5/2008 | Oh et al. | 438/762 |
| 2008/0176364 A1 * | 7/2008 | Yang et al. | 438/151 |
| 2008/0277658 A1 * | 11/2008 | Lee et al. | 257/43 |
| 2009/0039354 A1 * | 2/2009 | Wang et al. | 257/72 |
| 2009/0057683 A1 * | 3/2009 | Nakajima et al. | 257/72 |
| 2009/0141207 A1 * | 6/2009 | Um et al. | 349/46 |
| 2009/0167974 A1 * | 7/2009 | Choi et al. | 349/43 |
| 2009/0180045 A1 * | 7/2009 | Yoon et al. | 349/43 |
| 2009/0278127 A1 * | 11/2009 | Kim et al. | 257/59 |
| 2010/0001284 A1 * | 1/2010 | Cho et al. | 257/72 |

\* cited by examiner

*Primary Examiner* — Nathan Ha
(74) *Attorney, Agent, or Firm* — H.C. Park & Associates, PLC

(57) ABSTRACT

Provided is a thin-film transistor (TFT) display panel having improved electrical and reliability properties and a method of fabricating the TFT display panel. The TFT display panel includes gate wiring formed on a substrate; an oxide active layer pattern formed on the gate wiring; data wiring formed on the oxide active layer pattern to cross the gate wiring; a passivation layer formed on the oxide active layer pattern and the data wiring and made of nitrogen oxide; and a pixel electrode disposed on the passivation layer.

20 Claims, 12 Drawing Sheets

THIN-FILM TRANSISTOR DISPLAY PANEL INCLUDING AN OXIDE ACTIVE LAYER AND A NITROGEN OXIDE PASSIVATION LAYER, AND METHOD OF FABRICATING THE SAME

This application claims priority from and the benefit of Korean Patent Application No. 10-2009-0061249, filed on Jul. 6, 2009, which is hereby incorporated by reference for all purposes as if fully set forth herein.

BACKGROUND OF THE INVENTION

1. Field of the Invention

Exemplary embodiments of the present invention relates to a thin-film transistor (TFT) display panel and a method of fabricating the same, and more particularly, to a TFT display panel having improved electrical properties and improved reliability by fabricating a oxide TFT and a method of fabricating the TFT display panel.

2. Discussion of the Background

Liquid crystal displays (LCDs) are one of the most widely used flat panel displays (FPDs). An LCD includes two substrates having electrodes formed thereon and a liquid crystal layer interposed between the two substrates. The LCD applies voltages to the electrodes to rearrange liquid crystal molecules of the liquid crystal layer and thus control the amount of light that passes through the liquid crystal layer.

With the soaring demand for LCDs, and in particular higher-quality LCDs, a lot of research is being conducted to develop LCDs with improved current and light tolerance. Oxide TFT display panels using oxide semiconductors as active layer patterns have high mobility, light insensitivity, and low-temperature deposition properties. Due to these properties, oxide TFT display panels are increasingly used in LCDs.

An oxide TFT display panel includes oxide active layer patterns made of an oxide semiconductor, a passivation layer disposed on the oxide active layer patterns, and a gate insulating film disposed under the oxide active layer patterns.

If the passivation layer or the gate insulating film contains hydrogen atoms, the hydrogen atoms may react with or diffuse into the oxide active layer patterns. Accordingly, the oxide active layer patterns may become conductive, rendering the oxide TFT display panel unable to perform its function.

SUMMARY OF THE INVENTION

Exemplary embodiments of the present invention provide a thin-film transistor (TFT) display panel having improved electrical properties and improved reliability that can be fabricated in less time than conventional counterparts.

Exemplary embodiments of the present invention also provide a method of fabricating a TFT display panel having improved electrical properties and improved reliability that can be fabricated in less time.

Additional features of the invention will be set forth in the description which follows, and in part will be apparent from the description, or may be learned by practice of the invention.

An exemplary embodiment of the present invention discloses a thin-film transistor (TFT) display panel that comprises gate wiring disposed on a substrate; an oxide active layer pattern disposed on the gate wiring; data wiring disposed on the oxide active layer pattern to cross the gate wiring; a passivation layer disposed on the oxide active layer pattern and the data wiring, the passivation layer comprising nitrogen oxide ($NO_x$); and a pixel electrode disposed on the passivation layer.

An exemplary embodiment of the present invention also discloses a method of fabricating a TFT display panel that comprises forming gate wiring on a substrate; forming an oxide active layer pattern on the gate wiring; forming data wiring on the oxide active layer pattern to cross the gate wiring; forming a passivation layer comprising nitrogen oxide (NOx) on the oxide active layer pattern and the data wiring; and forming a pixel electrode on the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
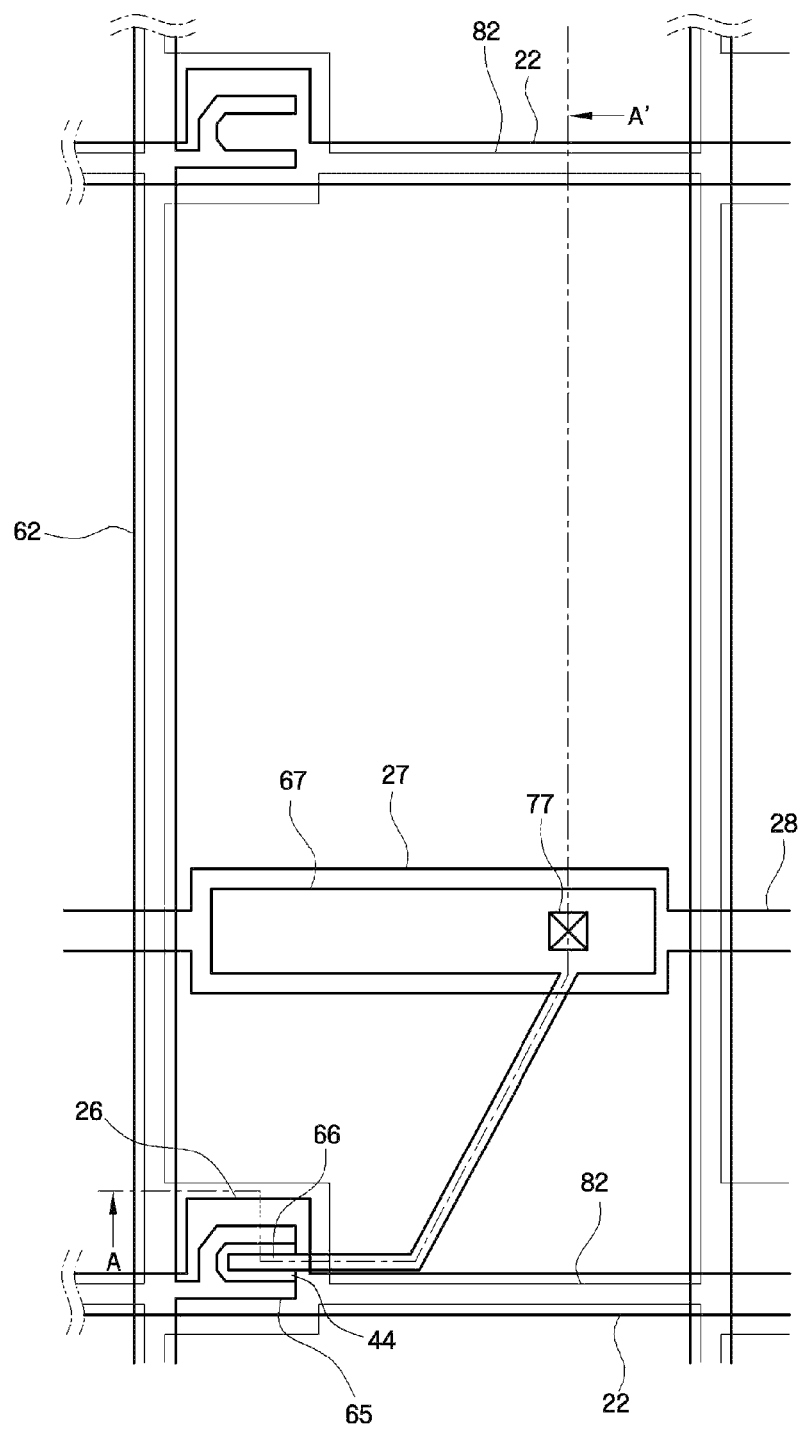
FIG. 1A is a plan view of a thin-film transistor (TFT) display panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or components would then be oriented "above" the other elements or components. Thus, the exemplary term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
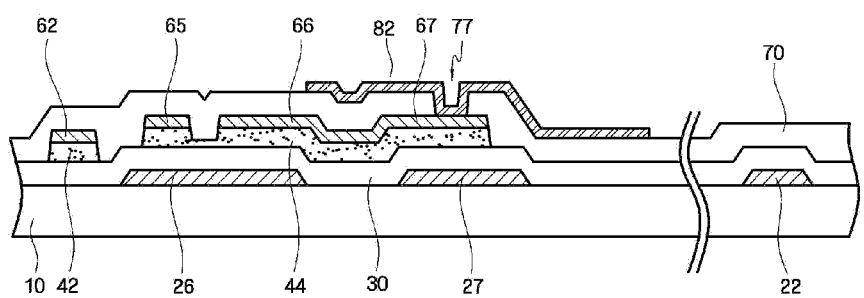
FIG. 1B is a cross-sectional view of the TFT display panel taken along the line A-A' of FIG. 1a according to an exemplary embodiment.

A thin-film transistor (TFT) display panel according to a first exemplary embodiment of the present invention will be described in detail with reference to FIG. 1A and FIG. 1B. FIG. 1A is a plan view of a TFT display panel according to the first exemplary embodiment of the present invention. FIG. 1B is a cross-sectional view of the TFT display panel taken along the line A-A' of FIG. 1A according to the exemplary embodiment.

Referring to FIGS. 1A and 1B, the TFT display panel includes various devices, such as TFTs, which are formed on an insulating substrate 10. The insulating substrate 10 may be made of materials such as glass, for example soda lime glass or boro-silicate glass, or plastic.

Gate wirings, which deliver gate signals, are also formed on the insulating substrate 10. The gate wiring includes a gate line 22, which extends in a first direction, for example a horizontal direction, and a gate electrode 26, which extends from the gate line 22 to form a part of the TFT.

In addition, storage wiring is formed on the insulating substrate 10. The storage wiring delivers a common voltage and includes a storage electrode 27 and a storage line 28. The storage line 28 may extend in the horizontal direction to be substantially parallel to the gate line 22. The storage electrode 27 may be wider than the storage line 28. The storage electrode 27 overlaps a drain electrode extension portion 67 that is connected to a pixel electrode 82, which will be described below, to form a storage capacitor that improves the charge storage capability of a pixel.

The storage wiring may have various shapes and may be disposed at various locations. In addition, if sufficient storage capacitance is generated by the overlapping of the pixel electrode 82 and the gate line 22, the storage wiring may be omitted.

Each of the gate wiring (i.e., the gate line 22 and the gate electrode 26) and the storage wiring (i.e., the storage electrode 27 and the storage line 28) may be made of an Al-based metal such as Al or Al alloy, an Ag-based metal such as Ag or Ag alloy, a Cu-based metal such as Cu or Cu alloy, an Mo-based metal such as Mo or Mo alloy, Cr, Ti, or Ta.

In addition, each of the gate wiring and the storage wiring may have a multilayer structure composed of two or more conductive layers (not shown) with different physical characteristics. In this case, one of the two conductive layers may be made of a metal with low resistivity such as an Al-based metal, an Ag-based metal, or a Cu-based metal in order to reduce a signal delay or a voltage drop of each of the gate wiring and the storage wiring. The other conductive layer may be made of a different material such as a material having superior contact characteristics with zinc oxide (ZnO), indium tin oxide (ITO), and indium zinc oxide (IZO). For example, the other conductive layer may be made of a Mo-based metal, Cr, Ti, or Ta. Examples of the multilayer structure include a combination of a lower Cr layer and an upper Al layer and a combination of a lower Al layer and an upper Mo layer. Each of the gate wiring and the storage wiring may be made of other suitable metals and conductive materials.

A gate insulating film 30, which may be made of silicon oxide ($SiO_x$), nitrogen oxide ($NO_x$), or silicon nitride ($SiN_x$), is formed on the gate wirings and the storage wirings.

Oxide active layer patterns 42 and 44 are formed on the gate insulating film 30. Each of the oxide active layer patterns 42 and 44 may be made of an oxide of a material selected from Zn, In, Ga, Sn, or a combination thereof. The term "active" denotes that each of the oxide active layer patterns 42 and 44 is made of a material that has electrical properties when driving current is applied to the active material. The active material includes a semiconductor and a metal oxide. For example, each oxide active layer patterns 42 and 44 may be made of a material selected from ZnO, InZnO, InGaO, InSnO, ZnSnO, GaSnO, GaZnO, GaZnSnO, and GaInZnO. Each of the oxide active layer patterns 42 and 44 may have 10 to 100 times greater effective charge mobility than hydrogenated amorphous silicon and has an ON/OFF current ratio of $10^5$ to $10^8$. Thus, the oxide active layer patterns 42 and 44 show excellent semiconductor properties.

In addition, each of the oxide active layer patterns 42 and 44 has a band gap of approximately 3.0 to 3.5 eV. Therefore, even when each of the oxide active layer patterns 42 and 44 is exposed to visible light, they do not experience photocurrent leakage. Consequently, an instantaneous afterimage may be prevented from being formed by an oxide TFT. In addition, since there is no need to form a light-blocking film under the oxide TFT, an aperture ratio of the TFT display panel may be increased.

In order to enhance the properties of an oxide TFT, each of the oxide active layer patterns 42 and 44 may additionally include an element that belongs to Group 3, 4, or 5 of the periodic table, or a transition element. Because each of the oxide active layer patterns 42 and 44 may be amorphous, they may have high effective charge mobility and may be formed by using a conventional method of fabricating amorphous silicon. Therefore, the oxide active layer patterns 42 and 44 can be used in display devices having large areas.

Data wiring is formed on the oxide active layer patterns 42 and 44 and the gate insulating film 30. The data wiring includes a data line 62, a source electrode 65, a drain electrode 66, and a drain electrode extension portion 67. The data line 62 extends in a second direction that is substantially perpendicular to the first direction and crosses the gate line 22 to define a pixel. The source electrode 65 branches from the data line 62 and extends on the oxide active layer patterns 42 and 44. The drain electrode 66 is separated from the source electrode 65 and is formed on the oxide active layer patterns 42 and 44 to face the source electrode 65 with respect to the gate electrode 26 or a channel region of the oxide TFT. The drain electrode extension portion 67, which is wider than the drain electrode 66, extends from the drain electrode 66 and overlaps the storage electrode 27.

As shown in FIG. 1B, the data wiring (i.e., the data line 62, the source electrode 65, the drain electrode 66, and the drain electrode extension portion 67) may directly contact the oxide active layer patterns 42 and 44 to form an ohmic contact. In order to form an ohmic contact, the data wiring may include a single layer or multiple layer structure made of a material or materials such as Ni, Co, Ti, Ag, Cu, Mo, Al, Be, Nb, Au, Fe, Se, and Ta. Examples of the multilayer structure include a double layer structure (such as Ta/Al, Ta/Al, Ni/Al, Co/Al, or Mo (Mo alloy)/Cu) and a triple layer structure (such as Ti/Al/Ti, Ta/Al/Ta, Ti/Al/TiN, Ta/Al/TaN, Ni/Al/Ni, or Co/Al/Co). The data wiring may also be made of materials other than the above materials. In addition, the data wiring may not directly contact the oxide active layer patterns 42 and 44. For example, an ohmic contact layer (not shown) may be formed between the data wiring and the oxide active layer patterns 42 and 44 to form an ohmic contact between them.

The source electrode 65 and the drain electrode 66 overlap at least part of each oxide active layer pattern 42 and 44.

A passivation layer 70 is formed on the data wiring and the oxide active layer patterns 42 and 44. In the present embodiment, the passivation layer 70 may be made of nitrogen oxide ($NO_x$). Since the passivation layer 70 according to the present exemplary embodiment directly contacts the oxide active layer patterns 42 and 44, the passivation layer 70 may contain a small number of hydrogen atoms. It is desirable to form the passivation layer 70 using nitrogen oxide ($NO_x$) that does not contain hydrogen. Hydrogen atoms contained in the passivation layer 70 may diffuse into the oxide active layer patterns 42 and 44, which may cause the oxide active layer patterns 42 and 44 to become conductive, thereby degrading the quality of the TFT display panel.

Since the TFT display panel according to the present exemplary embodiment uses the passivation layer 70 made of nitrogen oxide ($NO_x$) that does not contain hydrogen, the electrical properties of the oxide active layer patterns 42 and 44 may be enhanced. The passivation layer 70 may have a thickness ranging from about 1,500 to about 2,500 Å. When the passivation layer 70 has a thickness of 1,500 Å or less, it may not function as intended. When the passivation layer 70 has a thickness of more than 2,500 Å, it may be difficult to mass-produce the passivation layer 70.

A passivation layer (not shown) having a double layer structure which includes a first layer made of nitrogen oxide ($NO_x$) and a second layer made of $SiN_x$ or $SiO_x$ may also be used as another way to enhance the properties of the oxide active layer patterns 42 and 44. A TFT display panel with a passivation layer 70 having a double layer will be compared with the TFT display panel according to the present exemplary embodiment.

A contact hole 77 is formed in the passivation layer 70 and extends to the drain electrode extension portion 67. A pixel electrode 82 is disposed on the passivation layer 70 and is electrically connected to the drain electrode 66 by the contact hole 77.

The pixel electrode 82 may be made of a transparent conductor such as ITO or IZO or a reflective conductor such as Al. When a data voltage is applied to the pixel electrode 82, the pixel electrode 82 generates an electric field together with a common electrode (not shown) and re-orients the liquid crystal molecules of a liquid crystal layer (not shown). Typically, the liquid crystal layer is interposed between the TFT display panel and a common electrode display panel (not shown). Several well-known methods of combining the common electrode and the liquid crystal layer with the TFT display panel exist.

Figure 2A:
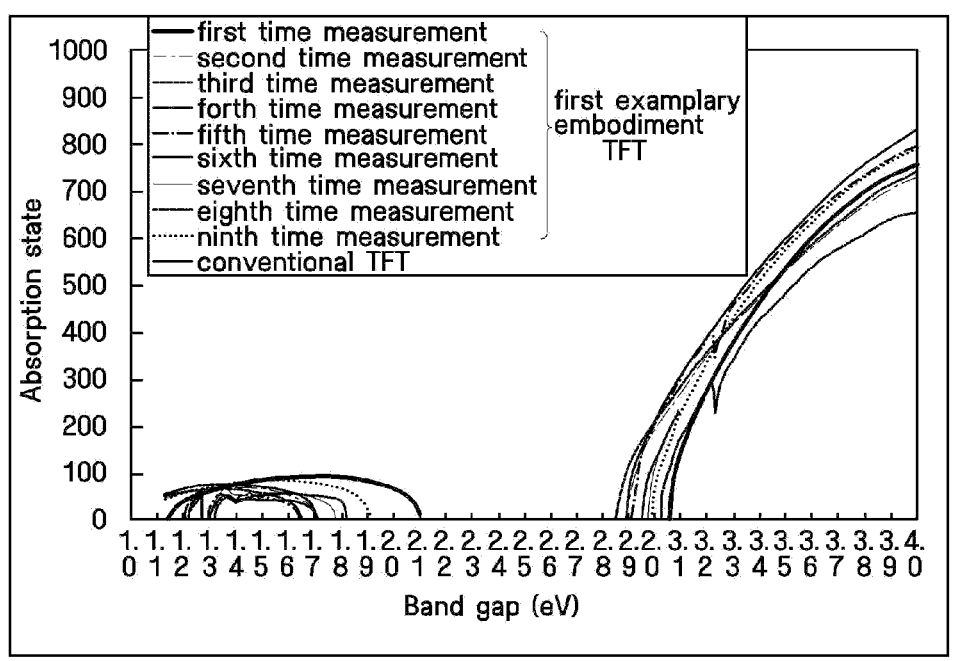
FIG. 2A is a graph showing the variation in absorption state and band gap properties for various samples for a TFT display panel made during a nitrogen flow rate of 6 sccm according to an exemplary embodiment of the invention.
Figure 2B:
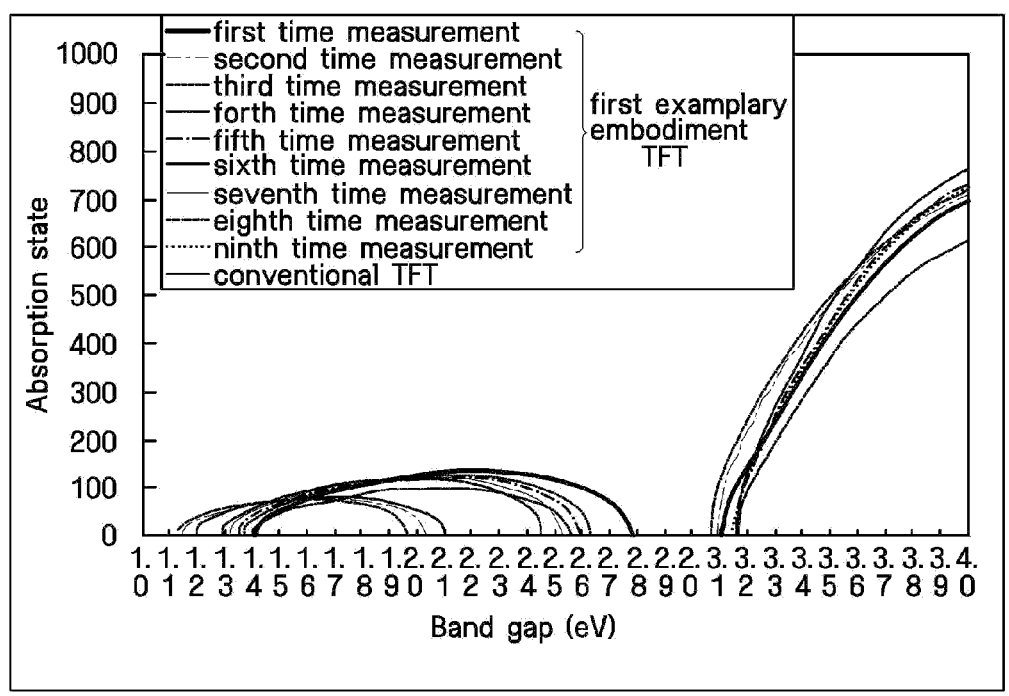
FIG. 2B is a graph showing the variation in the absorption state and band gap properties for various samples for a TFT display panel made during a nitrogen flow rate of 3 sccm according to an exemplary embodiment of the invention.
Figure 3A:
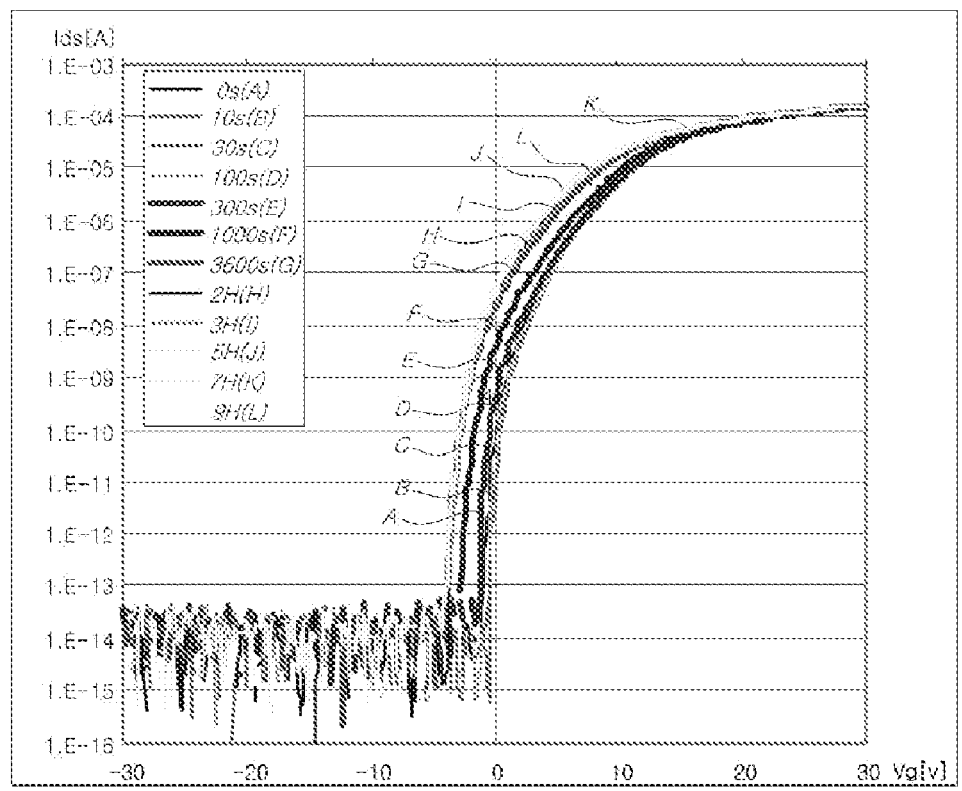
FIG. 3A and FIG. 3B are graphs showing the variation in voltage and current properties in response to applied stresses for a TFT display panel according to an exemplary embodiment of the invention and a conventional TFT display panel, respectively.
Figure 3B:
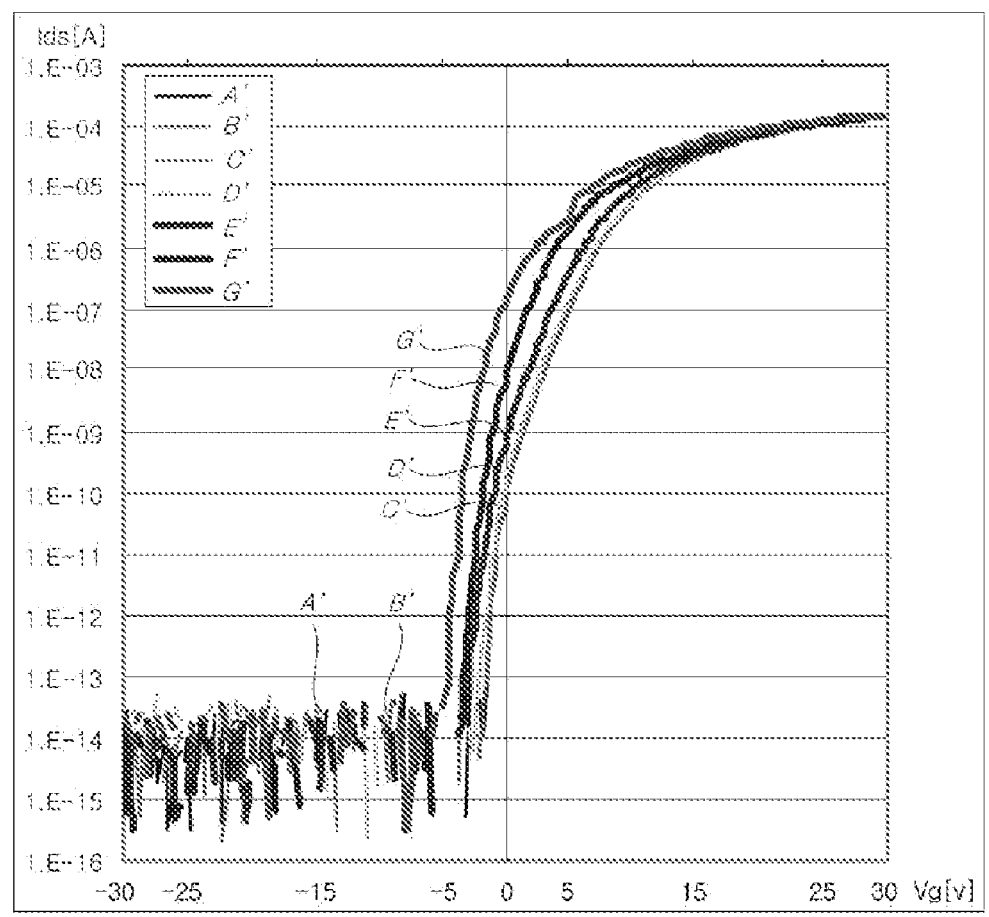
Figure 4A:
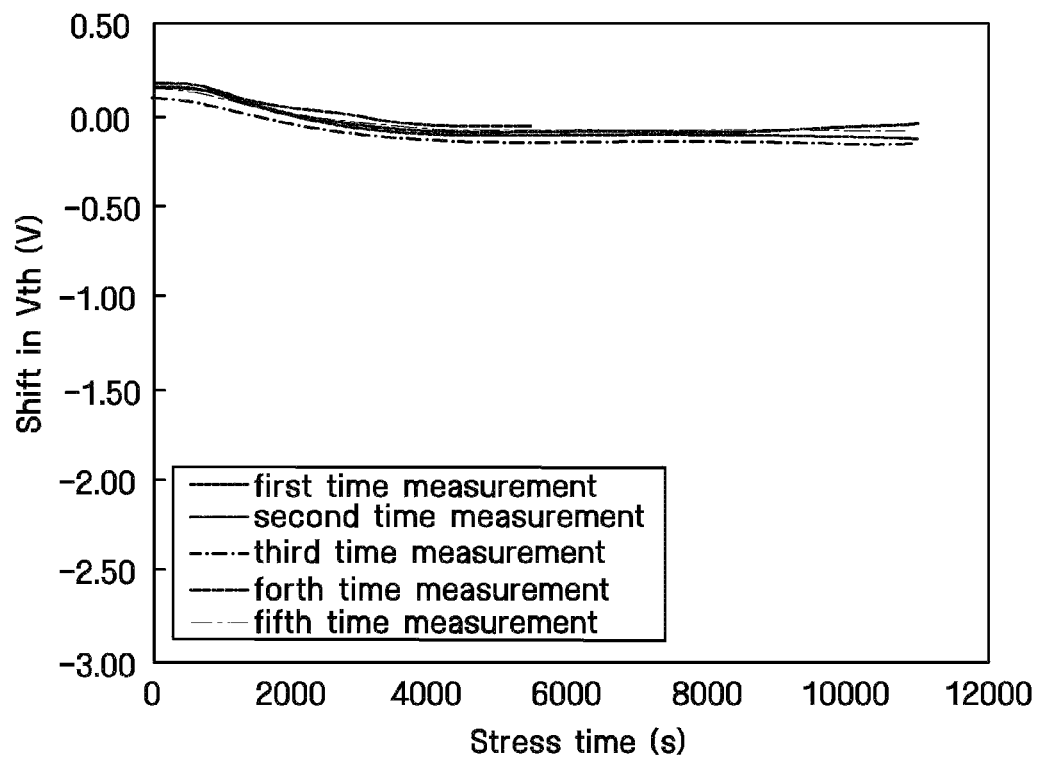
FIG. 4A and FIG. 4B are graphs showing the shift in threshold voltage of a TFT display panel of an exemplary embodiment of the present invention and a conventional TFT display panel, respectively.
Figure 4B:
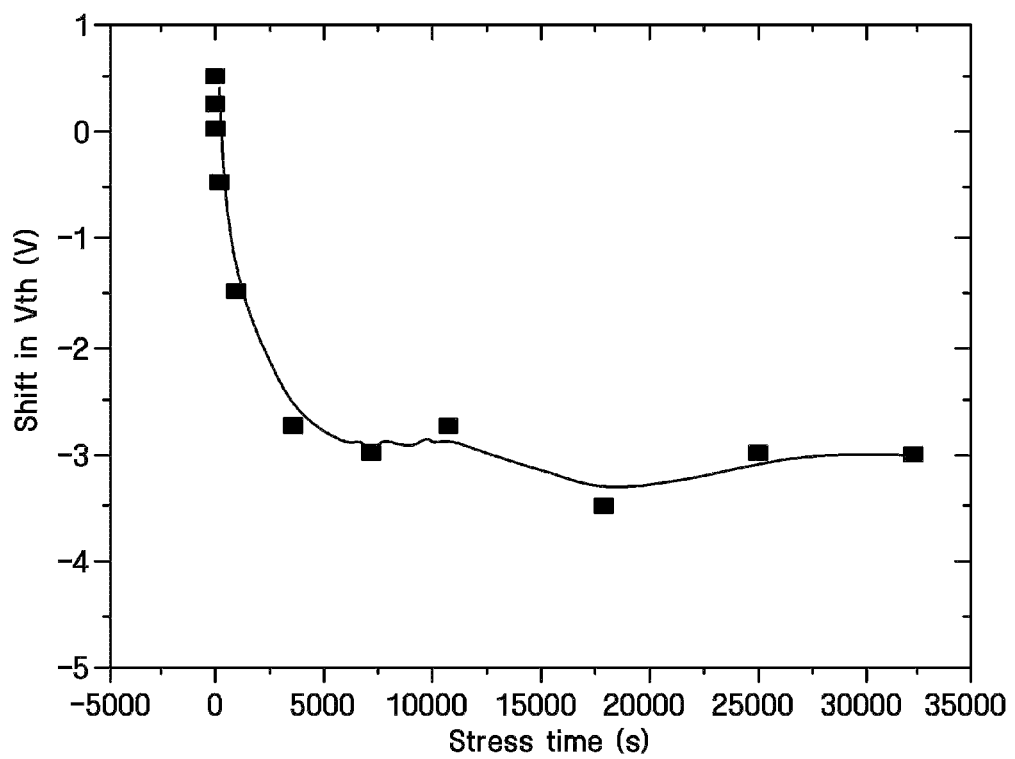

Hereinafter, the voltage and current properties of the TFT display panel according to the first exemplary embodiment are compared with a TFT display panel according to a comparative example with reference to FIG. 2A, FIG. 2B, FIG. 3A, FIG. 3B, FIG. 4A, and FIG. 4B. FIG. 2A and FIG. 2B are graphs showing the variation in the band gap and absorption state properties for various samples for the TFT display of the first embodiment and for a conventional TFT display panel. FIG. 3A and FIG. 3B are graphs showing the variation in the voltage and current properties in response to an applied voltage stress for the TFT display panel of the first embodiment and a conventional TFT display panel, respectively. The period during which the stress is applied to the panels is herein referred to as "stress time." Stress is applied by a voltage applied to the panel for long times. FIG. 4A and FIG. 4B are graphs showing a shift in a threshold voltage $V_{th}$ of each of the TFT display panel of the first embodiment and a conventional TFT display panel, respectively.

The "conventional TFT display panel" includes a passivation layer that is made of $SiO_x$ or $SiN_x$ formed on oxide active layer patterns.

The data provided in FIG. 2A was obtained by measuring the variation in the absorption state and the band gap properties for various samples for a TFT display panel made during a nitrogen flow rate of 6 sccm according to an exemplary embodiment of the present invention. The absorption state and the band gap properties of the TFT display panel according to the first exemplary embodiment was measured nine times. According to the measurement results, a band gap of the first exemplary embodiment TFT increases about 1.0 eV as compared to that of the conventional TFT.

The data shown in FIG. 2B was obtained by measuring the variation in the absorption state and the band gap properties for various samples for a TFT display panel made during a nitrogen flow rate of 3 sccm according to an exemplary embodiment of the present invention. The absorption state and the band gap properties of the TFT display panel according to the first exemplary embodiment was measured nine times. According to the measurement results, the band gap of the first exemplary embodiment's TFT increases about 0.5 eV as compared to the conventional TFT.

According to the measurement results shown in FIG. 2A and FIG. 2B, a shift in the band gap occurred. In addition, the band gap energy for the TFT display panel of the first exemplary embodiment may be controlled by fabricating the passivation layer containing the nitrogen oxide ($NO_x$) in the presence of a controlled nitrogen flow rate.

The data shown in FIG. 3A was obtained by measuring the drain-source current $I_{ds}$ of the TFT display panel of the first exemplary embodiment with respect to the gate voltage $V_g$ while varying the stress time for the voltage applied to the TFT display panel. When a voltage stress was applied to the TFT display panel of the first exemplary embodiment for stress times of 0 seconds (0 s), 10 seconds (10 s), 30 seconds (30 s), 100 seconds (100 s), 300 seconds (300 s), 1000 seconds (1000 s), 3600 seconds (3600 s), 2 hours (2 H), 3 hours (3 H), 5 hours (5 H), 7 hours (7 H), and 9 hours (9 H), a minor shift in $V_{th}$ occurred for the TFT display panel according to the first exemplary embodiment. That is, the TFT display panel of the first exemplary embodiment, which includes the passivation layer 70 formed as an $NO_x$ layer, exhibited greater stability during the stress time than the conventional TFT display panel.

The data provided in FIG. 3B was obtained by measuring the drain-source current $I_{ds}$ of the TFT display panel of a conventional TFT with respect to the gate voltage $V_g$ while varying the stress time for voltage applied to the TFT display panel. When a voltage stress was applied to the TFT display panel of the first exemplary embodiment for stress times of 0 s, 10 s, 30 s, 100 s, 300 s, 1000 s, and 3600 s, there was a larger shift in $V_{th}$ for the conventional TFT display panel as compared with the TFT display panel of the first exemplary embodiment.

FIG. 4A and FIG. 4B are graphs showing a shift in $V_{th}$ of the TFT display panel of the first exemplary embodiment and a conventional TFT display panel as a function of stress time. The data shown in FIG. 4A may be converted into numerical values as shown in Table 1.

| Time (sec) | Shift in $V_{th}$ (V) (First Exemplary Embodiment) |
| --- | --- |
| 0 | 0 |
| 30 | 0.05 |
| 100 | 0.07 |
| 300 | 0.05 |
| 1000 | −0.02 |
| 3600 | −0.16 |
| 7200 | −0.20 |
| 10800 | −0.19 |

Referring to FIG. 4A, FIG. 4B and Table 1, the above results indicate that the TFT display panel of the first exemplary embodiment, which includes the passivation layer 70 made of $NO_x$, has improved current and voltage stability as compared to the conventional TFT display panel.

Hereinafter, a method of fabricating a TFT display panel according to a second exemplary embodiment of the present invention will be described with reference to FIG. 1A, FIG. 1B, and FIGS. 5 through 14. FIGS. 5 through 14 are cross-sectional views showing processes of fabricating the TFT display panel according to the second exemplary embodiment of the present invention. For simplicity, a description of elements that are substantially identical to those of the first exemplary embodiment will not be repeated.

Figure 5:
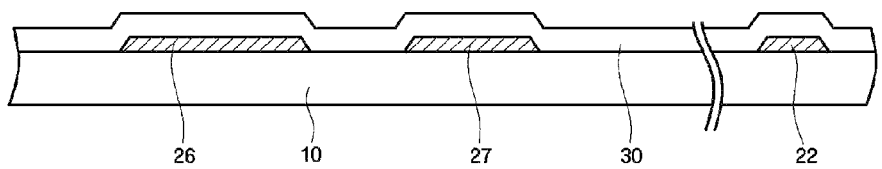
FIG. 5, FIG. 6, FIG. 7, FIG. 8, FIG. 9, FIG. 10, FIG. 11, FIG. 12, and FIG. 13 are cross-sectional views showing processes for fabricating a TFT display panel according to an exemplary embodiment of the present invention.

Referring to FIG. 1A and FIG. 5, metal layers (not shown) may be disposed on an insulating substrate 10 and patterned to form gate wiring. Gate wiring includes a gate line 22, a gate electrode 26, a storage electrode 27, and a storage line 28. Sputtering may be used to form the gate wiring and may be performed within a temperature range of 200° C. or below, which is a low temperature as compared with many sputtering methods. When the gate wiring is formed by low temperature sputtering, deterioration may be prevented of the insulating substrate 10, which may be composed of a glass material such as soda lime glass. The above conductive (e.g., metallic) layers may be patterned by a wet-etching process or a dry-etching process. In the wet-etching process, an etchant such as phosphoric acid, nitric acid, or acetic acid may be used.

Next, a gate insulating film 30 is formed on the insulating substrate 10 and the gate wiring (i.e., the gate line 22, the gate electrode 26, the storage electrode 27, and the storage line 28). The gate insulating film 30 may be made of $SiN_x$ and may be deposited by plasma enhanced chemical vapor deposition (PECVD) or reactive sputtering. If the substrate 10 is made of a material with low thermal tolerance, the gate insulating film 30 may be formed in a low temperature range of 130° C. or below.

Figure 6:
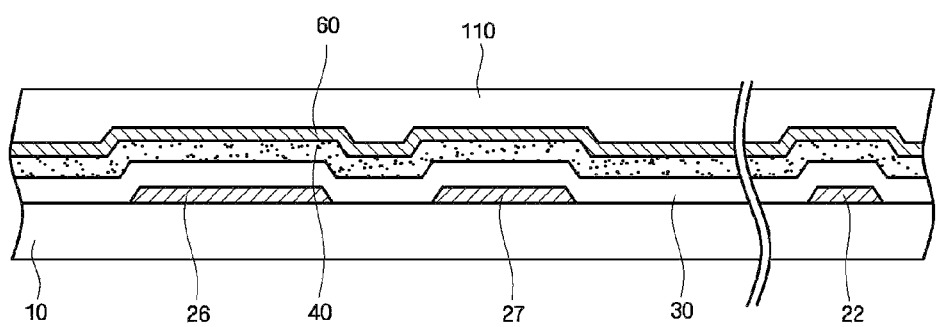

Referring to FIG. 6, an oxide active layer 40 and a conductive layer 60 for forming the data wiring are sequentially deposited on the gate insulating film 30 by sputtering for example. The oxide active layer 40 and the conductive layer 60 are sequentially deposited in a vacuum chamber. The vacuum chamber may remain under vacuum conditions to prevent the properties of the oxide active layer 40 from deteriorating due to atmospheric oxygen contamination. The term "active" denotes that the oxide active layer 40 is made of a material that has electrical properties when a driving current is applied to the active material. The active material may include a semiconductor and a metal oxide. Next, the conductive layer 60 is coated with a photoresist layer 110.

Figure 7:
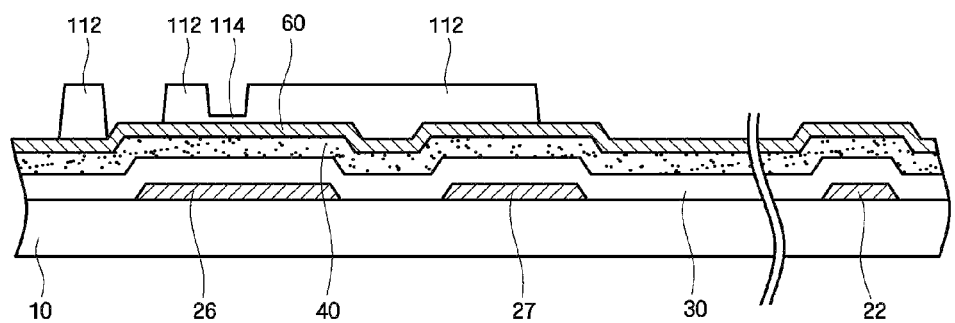

Referring to FIG. 6 and FIG. 7, the photoresist layer 110 is exposed to light radiating through a mask, and then the resulting irradiated structure is developed to form the photoresist layer patterns 112 and 114. The photoresist layer pattern 114 is disposed on a channel region of a TFT, that is, the photoresist layer pattern 114 is disposed between a source electrode 65 and a drain electrode 66 (see FIG. 10). The photoresist layer pattern 112 is disposed in a data-wiring region, i.e., a region where each of the data wiring is formed. The photoresist layer pattern 114 is thinner than the photoresist layer pattern 112. The entire photoresist layer 110 is removed except for its portions remaining in the channel region and the data-wiring region. In this case, a ratio of the thickness of the photoresist layer pattern 114 remaining in the channel region to that of the photoresist layer pattern 112 remaining in the data-wiring region may vary according to processing conditions during etching processes that will be described below.

To vary the thickness of the photoresist layer 110 (supra), various methods may be used. For example, a mask having a slit, a lattice pattern, or a semi-transparent film may be used to control the amount of light that passes through the photoresist layer 110. The photoresist layer 110 may be made of a material that can reflow. In this case, the photoresist layer 110 may be exposed to light by using a conventional mask that is divided into a transparent region that transmits nearly all of the light and a semi-transparent region that partially transmits light. Then, the photoresist layer 110 may be developed and reflowed so that part of the photoresist layer 110 can flow to a region without the photoresist layer 110. As a result, the thin photoresist layer pattern 114 may be formed.

Figure 8:
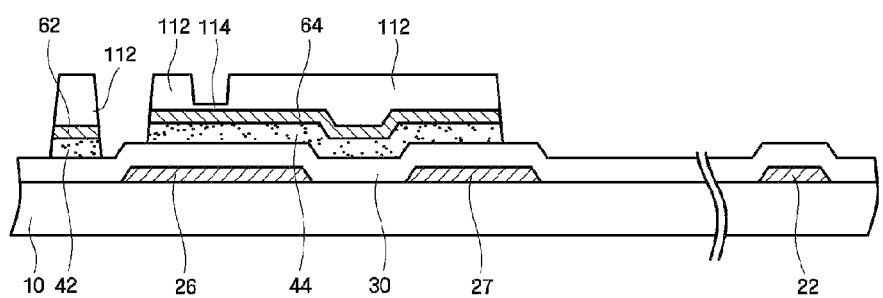

Referring to FIG. 7 and FIG. 8, the conductive layer 60 is etched while using the photoresist layer patterns 112 and 114 as an etching mask. Here, the conductive layer 60 may be wet-etched or dry-etched. In the wet-etching process, a mixture of phosphoric acid, nitric acid, and acetic acid or a mixture of hydrofluoric acid (HF) and deionized water may be used as an etchant solution. The entire conductive layer 60 is removed except for the portion corresponding to a data line 62 and a conductive layer pattern 64 for forming the source electrode 65 and the drain electrode 66. After the conductive layer 60 is removed, the oxide active layer 40 disposed under the conductive layer 60 is exposed. The data line 62 and the conductive layer pattern 64 are shaped like the data wiring (see FIG. 10) except that the conductive layer pattern 64 is not yet divided into the source electrode 65 (see FIG. 10) and the drain electrode 66 (see FIG. 10).

Next, the oxide active layer 40 is etched using the photoresist layer patterns 112 and 114 as an etching mask to form oxide active layer patterns 42 and 44. In this case, the oxide active layer 40 may be selectively etched while the gate insulating film 30 is not etched. In addition, the oxide active layer 40 may be wet-etched or dry-etched. In the wet-etching process, an etchant solution, which contains HF and de-ionized water, sulfuric acid, hydrochloric acid, or a combination thereof, may be used. In the dry-etching process, a fluorine-containing etching gas such as $CHF_3$ or $CF_4$ may be used. Specifically, a fluorine-containing etching gas mixed with Ar or He may be used. Alternatively, both the conductive layer 60 and the oxide active layer 40 may be patterned simultaneously by the wet-etching process.

Figure 9:
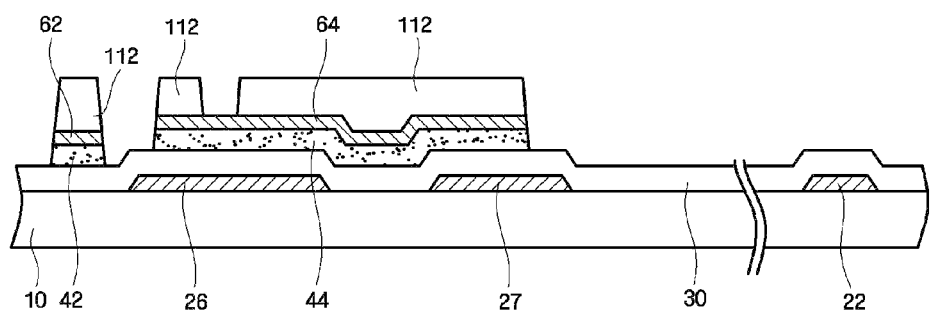

Referring to FIG. 8 and FIG. 9, the photoresist layer patterns 112 and 114 are etched to remove the photoresist layer pattern 114 in the channel region. In addition, residues of the photoresist layer 110, which may remain on a surface of the conductive layer pattern 64, are removed by an ashing process.

Figure 10:
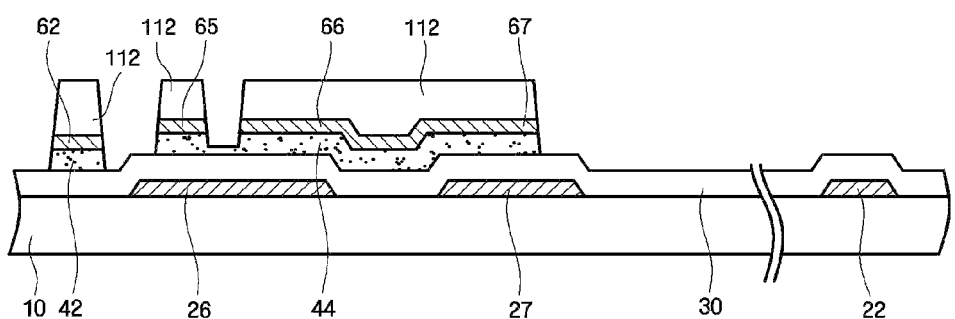

Referring to FIGS. 9 and 10, the conductive layer pattern 64 in the channel region is wet-etched or dry-etched by using the photoresist layer pattern 112 as an etching mask. In the wet-etching process, a mixture of phosphoric acid, nitric acid, and acetic acid or a solution of HF and deionized water may be used as an etchant solution. Part of the oxide active layer pattern 44 in the channel region may also be removed to a desired thickness.

As a result, the source electrode 65 is separated from the drain electrode 66 to complete the data wiring. The data wiring includes the data line 62, the source electrode 65, the drain electrode 66, and the drain electrode extension portion 67. The data line 62 extends in the vertical direction and crosses the gate line 22 to define a pixel. The source electrode 65 branches from the data line 62 and extends on the oxide active layer pattern 44. The drain electrode 66 is separated from the source electrode 65 and is disposed on the oxide active layer pattern 44. The drain electrode extension portion 67, which is wider than the drain electrode 66, extends from the drain electrode 66 and overlaps the storage electrode 27.

Figure 11:
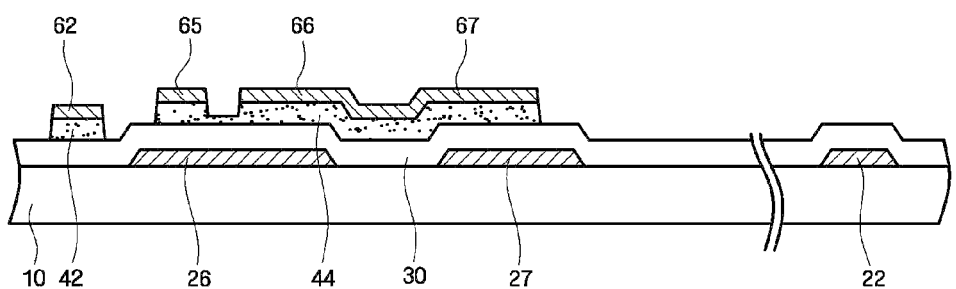

Referring to FIG. 10 and FIG. 11, the photoresist layer pattern 112 remaining on the data wiring is removed.

Figure 12:
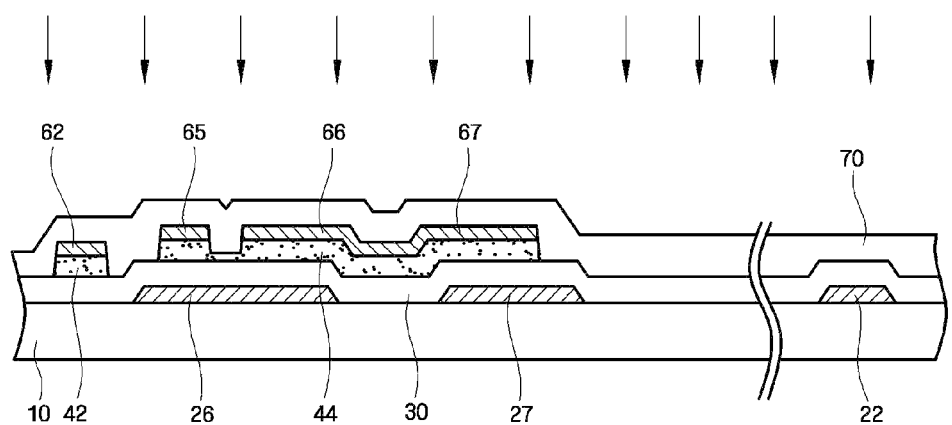

Referring to FIG. 11 and FIG. 12, a passivation layer 70 composed of $NO_x$ is disposed on the oxide active layer patterns 42 and 44 and the data wirings. The passivation layer 70 may be deposited, for example, by sputtering deposition that deposits the oxide active layer 40. The $NO_x$ contained in the passivation layer 70 may be formed by a sputtering process that mixes dopant nitrogen with a gas such as an oxide forming gas. The band gap energy is controlled by metering the nitrogen flow rate. The stability of a TFT display panel may be improved by protecting the oxide active layer 40 by means of the passivation layer 70 containing $NO_x$. The passivation layer 70 may contain $NO_x$ with a minimum amount of hydrogen; however, it is desirable to form the passivation layer 70 with hydrogen-free $NO_x$. Hydrogen can create oxygen vacancies in the oxide active layer via reaction and may reduce the oxide active layer. The oxygen vacancies increase carriers in a channel region of the oxide active layer. If the passivation layer 70 contains a high hydrogen concentration, the carrier concentration increases, and $V_{th}$ decreases, thereby causing the oxide active layer to behave as a conductive layer. Accordingly, the hydrogen concentration in the gate insulation film 30 and the passivation layer 70 is preferably kept low because the gate insulation film 30 and the passivation layer 70 contact the oxide active layers 42 and 44.

The passivation layer 70 may be formed from flows of $N_2$, He or Ar, and $O_2$ as gas sources. A ratio of the flow rates of the Ar, $O_2$, and $N_2$ may be 50:10:6 or 50:63:12. The $N_2$ flow rate desirably ranges from about 6 sccm to about 12 sccm. More preferably, the ratio of the combined flow rates of $N_2$ and $O_2$ to the flow rate of Ar may be 3:1. Also, a ratio of the flow rate of the $N_2$ to the combined flow rates of the $N_2$ and $O_2$ may be 0.5:1. The power supplied to the deposition chamber may range from about 0.3 $W/cm^2$ to about 0.7 $W/cm^2$, preferably about 0.5 $W/cm^2$. The passivation film 70 and gate insulating film 30 may have a thickness ranging from about 300 Å to about 4000 Å. Power per unit area applied to the deposition chamber, pressure of the deposition chamber, flow rates of source gases, and similar process parameters may determine the material composition of the passivation layer 70. The composition of the passivation layer 70 was determined by using an Ellipso meter technique. When the passivation layer 70 contains $NO_x$ formed by adjusting the processing conditions, the passivation layer 70 may contain a low amount of hydrogen so that it does not deteriorate the electrical properties of the oxide active layer patterns 42 and 44.

Figure 13:
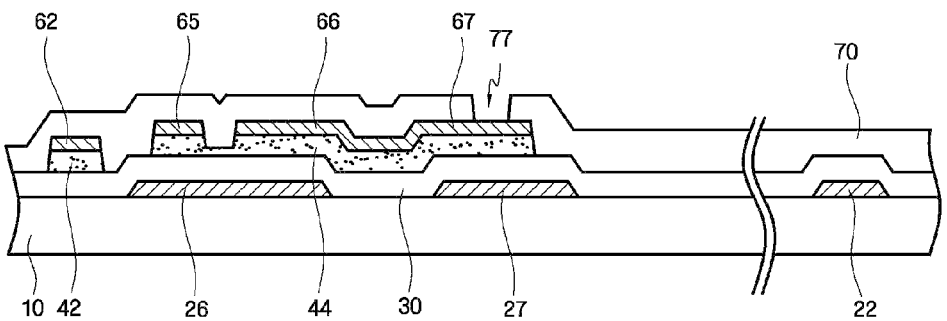

Referring to FIG. 13, a photolithography process is performed on the passivation layer 70 to form a contact hole 77 that extends to the drain electrode extension portion 67. Finally, a transparent conductor or a reflective conductor such as ITO or IZO may be deposited, and a photolithography process may be performed on the transparent or reflective conductor to form a pixel electrode 82. As a result, the TFT display panel according to the second exemplary embodiment (see FIG. 1B) is completed.

Hereinafter, a TFT display panel according to a third exemplary embodiment of the present invention will be described in detail with reference to FIG. 14, which is a cross-sectional view of the TFT display panel according to the third exemplary embodiment of the present invention.

Materials for the gate insulating film 30 and the passivation layer 70 of the third exemplary embodiment may be different than the materials used in the TFT display panel of the first exemplary embodiment.

Figure 14:
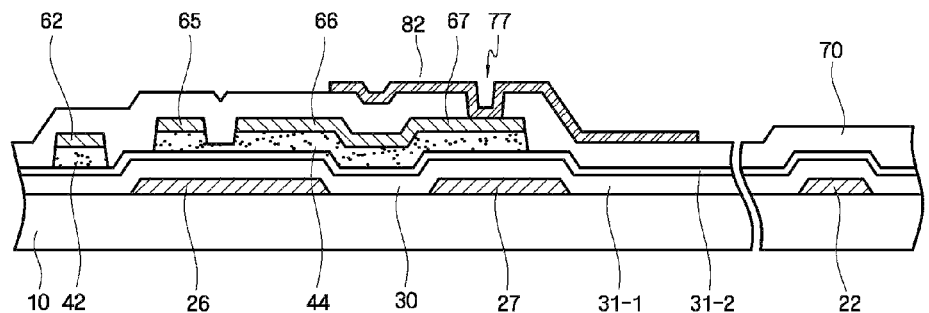
FIG. 14 is a cross-sectional view of a TFT display panel according to an exemplary embodiment of the present invention.

Referring to FIG. 14, the gate insulating film 30 includes a lower gate insulating film 31-1 that may contain $SiN_x$ and an upper gate insulating film 31-2 that is formed on the lower gate insulating film 31-1 and may contain $NO_x$ that may contain hydrogen. Since the lower gate insulating film 31-1 containing hydrogen may have a high deposition rate compared to hydrogen-free $NO_x$, it can be formed at low cost.

The upper gate insulating film 31-2 may include $NO_x$ with a smaller amount of hydrogen than the $SiN_x$ film. Preferably, the $NO_x$ does not contain hydrogen. When the upper gate insulating film 31-2 does not contain hydrogen, hydrogen migration to the oxide active layer patterns 42 and 44 may be prevented. Thus, the electrical properties of the lower gate insulating film 31-1 are maintained. The upper gate insulating film 31-2 can prevent hydrogen of the lower gate insulating film 31-1 from migrating to the oxide active layer patterns 42 and 44 and thus preventing the oxide active layer patterns 42 and 44 from becoming conductive.

In consideration of processing time and cost, the upper gate insulating film 31-2 and the lower gate insulating films 31-1 may have thicknesses ranging from about 500 Å to about 4000 Å.

The passivation layer 70 according to the third exemplary embodiment may contain inorganic matter such as $NO_x$. The organic matter may be photosensitive, may have superior planarization properties, or may have a low-k dielectric material formed by PECVD such as α-Si:C:O or α-Si:O:F. The passivation layer 70 may have a double-layer structure composed of a lower inorganic layer and an upper organic layer. Also, the passivation layer 70 may have a double-layer structure composed of a lower inorganic layer and an upper inorganic layer.

The passivation layer 70 according to the third exemplary embodiment may be substantially similar to the passivation layer 70 of the first exemplary embodiment. That is, the passivation layer 70 according to the third exemplary embodiment may also be made of hydrogen-free $NO_x$. In this case, the upper surfaces of the oxide active layer patterns 42 and 44 may be protected by the passivation layer 70 containing $NO_x$, and the lower surfaces of the oxide active layer patterns 42 and 44 may be protected by the upper gate insulating film 31-2 containing $NO_x$. Thus, the introduction of hydrogen into the oxide active layer patterns 42 and 44 may be prevented or inconsequentially low, thereby improving the electrical properties of the oxide active layer patterns 42 and 44.

Figure 15:
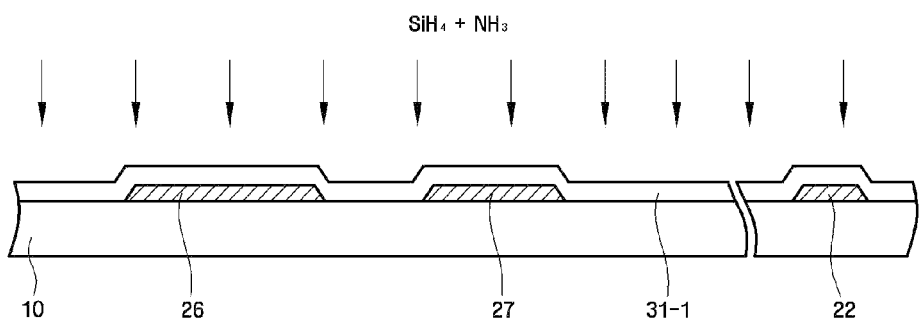
FIG. 15 and FIG. 16 are cross-sectional views showing processes for fabricating a TFT display panel according to an exemplary embodiment of the present invention.
Figure 16:
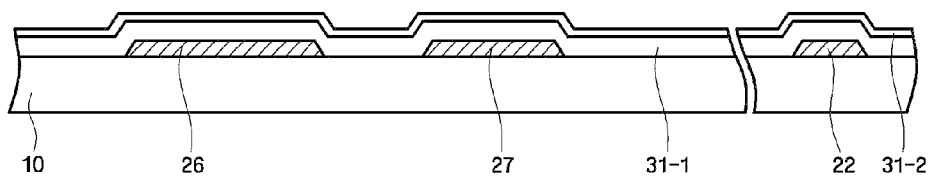

Hereinafter, a method of fabricating a TFT display panel according to a fourth exemplary embodiment of the present invention will be described with reference to FIG. 14, FIG. 15, and FIG. 16. FIG. 15 and FIG. 16 are cross-sectional views corresponding to a method of fabricating the TFT display panel according to the fourth exemplary embodiment of the present invention.

Referring to FIG. 15, gate wiring is disposed on an insulating substrate 10. Then, a lower gate insulating film 31-1 is disposed on the insulating substrate 10 and the gate wiring. The lower gate insulating film 31-1 may be formed using $NH_3$ or $SiH_4$ gas. The lower gate insulating film 31-1 may contain $SiN_x$ containing a large amount of hydrogen.

Referring to FIG. 16, an upper gate insulating film 31-2 is disposed on the lower gate insulating film 31-1. The upper gate insulating film 31-2 may be formed by using $N_2$, He or Ar, and $O_2$ as source gases. A ratio of the flow rates of $Ar:O_2:N_2$ may be 50:10:6 or 50:63:12. The $N_2$ flow rate preferably ranges from about 6 sccm to about 12 sccm. Preferably, a ratio of the combined flow rates of $N_2$ and $O_2$ to the flow rate of Ar may be 3:1. Also, a ratio of the flow rate of $N_2$ to the combined flow rates of $N_2$ and $O_2$ may be 0.5:1. The power supplied to the deposition chamber may range from about 0.3 W/cm² to about 0.7 W/cm² and preferably is about 0.5 W/cm². The passivation layer 70 and gate insulating film 30 may have thicknesses ranging from about 300 Å to about 4000 Å. Thus, the upper gate insulating film 31-2 may contain $NO_x$ with a smaller amount of hydrogen than the $SiN_x$. Process conditions for forming the upper gate insulating film 31-2 may be substantially similar to the conditions used to form the passivation layer 70 according to the second exemplary embodiment.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A thin-film transistor (TFT) display panel, comprising:
   gate wiring disposed on a substrate;
   an oxide active layer pattern disposed on the gate wiring;
   data wiring disposed on the oxide active layer pattern to cross the gate wiring;
   a passivation layer disposed on the oxide active layer pattern and the data wiring, the passivation layer comprising nitrogen oxide ($NO_x$); and
   a pixel electrode disposed on the passivation layer.

2. The display panel of claim 1, wherein the passivation layer does not contain hydrogen.

3. The display panel of claim 1, wherein the oxide active layer pattern comprises at least one material selected from ZnO, InZnO, InGaO, InSnO, ZnSnO, GaSnO, GaZnO, GaZnSnO, and GaInZnO.

4. The display panel of claim 1, further comprising a gate insulating film, the gate insulating film comprising:
   a lower gate insulating film disposed on the gate wiring and comprising $SiN_x$; and
   an upper gate insulating film disposed on the lower gate insulating film and comprising $NO_x$.

5. The display panel of claim 4, wherein the upper gate insulating film comprises less hydrogen than the lower gate insulating film.

6. The display panel of claim 5, wherein the passivation layer does not contain hydrogen.

7. The display panel of claim 2, wherein the passivation layer comprises a double layer structure, the double layer structure comprising a first layer comprising $SiN_x$ and second layer comprising $NO_x$.

8. The display panel of claim 7, wherein the oxide active layer pattern comprises at least one material selected from ZnO, InZnO, InGaO, InSnO, ZnSnO, GaSnO, GaZnO, GaZnSnO, and GaInZnO.

9. A method of fabricating a TFT display panel, the method comprising:
   forming gate wiring on a substrate;
   forming an oxide active layer pattern on the gate wiring;
   forming data wiring on the oxide active layer pattern to cross the gate wiring;
   forming a passivation layer comprising nitrogen oxide ($NO_x$) on the oxide active layer pattern and the data wiring; and
   forming a pixel electrode on the passivation layer.

10. The method of claim 9, wherein the passivation layer is formed in the presence of source gases, the source gases comprising nitrogen ($N_2$), helium (He) or argon (Ar), and oxygen ($O_2$).

11. The method of claim 10, wherein the source gases further comprise flow rates, wherein the flow rate of $N_2$ ranges from 6 sccm to 12 sccm, and a ratio of the combined flow rates of $N_2$ and $O_2$ to the flow rate of Ar is 3:1.

12. The method of claim 10, wherein the passivation layer is formed under electrical conditions for deposition ranging from 0.3 W/cm² to 0.7 W/cm².

13. The method of claim 10, wherein the passivation layer does not contain hydrogen.

14. The method of claim 9, further comprising:
   forming a lower gate insulating film comprising $SiN_x$ on the gate wiring; and
   forming an upper gate insulating film comprising $NO_x$ on the lower gate insulating film.

15. The method of claim 14, wherein the upper gate insulating film is formed in the presence of source gases, the source gases comprising $N_2$, He or Ar, and $O_2$.

16. The method of claim 15, wherein the passivation layer comprises a bilayer, the bilayer comprising:
   a first layer comprising the $NO_x$; and
   a second insulating layer.

17. The method of claim 16, wherein the first layer comprises less hydrogen than the second insulating layer.

18. The method of claim 16, wherein the second insulating layer comprises organic material.

19. The method of claim 14, wherein the upper gate insulating film does not contain hydrogen.

20. The method of claim 14, wherein the passivation layer does not contain hydrogen.

* * * * *